United States Patent [19]

Donley

[11] 4,364,167

[45] Dec. 21, 1982

[54] PROGRAMMING AN IGFET READ-ONLY-MEMORY

[75] Inventor: William B. Donley, Kokomo, Ind.

[73] Assignee: General Motors Corporation, Detroit, Mich.

[21] Appl. No.: 252,203

[22] Filed: Apr. 8, 1981

Related U.S. Application Data

[62] Division of Ser. No. 98,211, Nov. 28, 1979, Pat. No. 4,295,209.

[51] Int. Cl.³ .................... B01J 17/00; G11C 11/40; G11C 17/00; H01L 21/263
[52] U.S. Cl. .................... 29/576 B; 29/571; 148/1.5; 148/187; 357/23; 357/45; 357/91
[58] Field of Search .............. 148/1.5, 187; 29/571, 29/576 B; 357/23 D, 23 VT, 91, 45

[56] References Cited

U.S. PATENT DOCUMENTS

| | | | |
|---|---|---|---|
| 3,475,234 | 10/1969 | Kerwin et al. | 148/187 |
| 3,541,543 | 11/1970 | Crawford et al. | 340/324 |
| 3,751,722 | 8/1973 | Richard | 317/235 R |
| 3,775,191 | 11/1973 | McQuhae | 148/1.5 |
| 3,914,855 | 10/1974 | Cheney et al. | 29/571 |
| 3,917,495 | 11/1975 | Horn et al. | 148/1.5 |
| 4,091,406 | 5/1978 | Lewis | 354/54 |
| 4,097,889 | 6/1978 | Kern et al. | 354/54 |
| 4,103,415 | 8/1978 | Hayes | 29/571 |
| 4,129,936 | 12/1978 | Takei | 29/571 |
| 4,136,434 | 1/1979 | Thibault et al. | 29/571 |
| 4,169,270 | 9/1979 | Hayes | 357/23 |
| 4,198,693 | 4/1980 | Kuo | 365/104 |
| 4,208,727 | 6/1980 | Redwine et al. | 357/45 |
| 4,208,780 | 6/1980 | Richman | 29/571 |
| 4,230,504 | 10/1980 | Kuo | 148/187 |
| 4,271,582 | 6/1981 | Shirai et al. | 29/571 |
| 4,290,184 | 9/1981 | Kuo | 29/571 |
| 4,294,001 | 10/1981 | Kuo | 29/571 |

OTHER PUBLICATIONS

"ROM Program Process . . . ", Electronics, May 25, 1978, pp. 39–40.

Primary Examiner—Upendra Roy
Attorney, Agent, or Firm—Robert J. Wallace

[57] ABSTRACT

An IGFET ROM is programmed late in its process of manufacture. An array of IGFETs having an operable channel region and gate electrode is provided. The gate electrode is penetrable by an ion beam. A first dielectric penetrable by the ion beam is deposited onto the array. A second dielectric not penetrable by the ion beam is then deposited onto the array. Windows are then etched into the second dielectric material but not the first, over channel regions of selected IGFETs. The wafer surface is given an ion implantation to change threshold voltage of those IGFETs selected. A metallization pattern is formed on the second dielectric, with the first dielectric providing an insulating coating for gate electrode portions otherwise exposed within the aforementioned windows.

3 Claims, 12 Drawing Figures

ETCH GLASS AND OXIDE

IMPLANT BORON

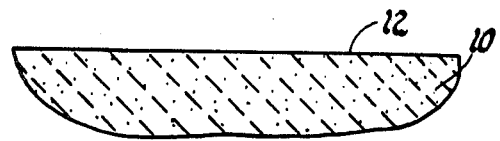
Fig.1 P-TYPE SILICON
Fig.2 OXIDIZE
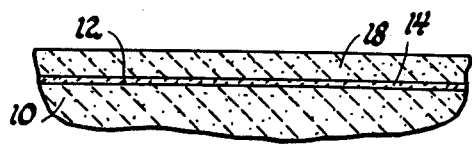
Fig.3 DEPOSIT POLY-SILICON
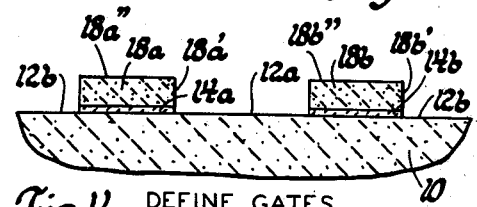
Fig.4 DEFINE GATES
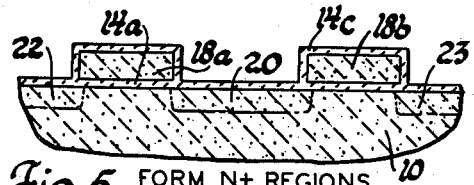
Fig.5 FORM N+ REGIONS
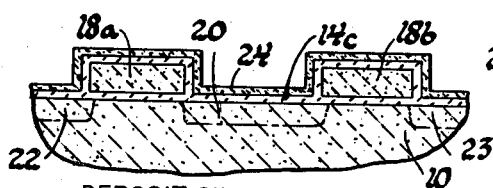
Fig.6 DEPOSIT SILICON NITRIDE
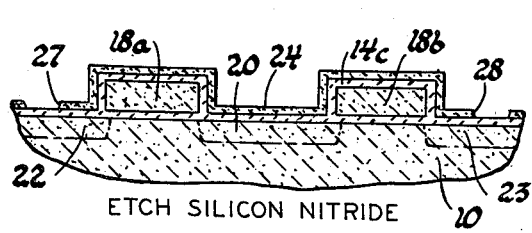
Fig.7 ETCH SILICON NITRIDE
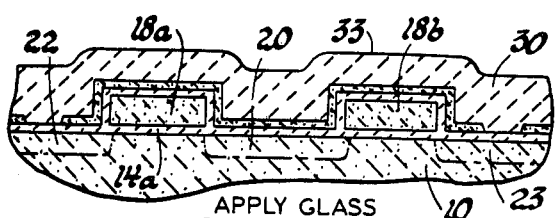
Fig.8 APPLY GLASS
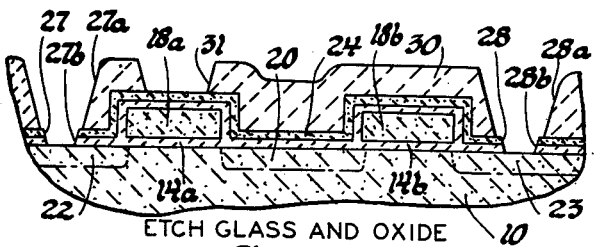
Fig.9 ETCH GLASS AND OXIDE
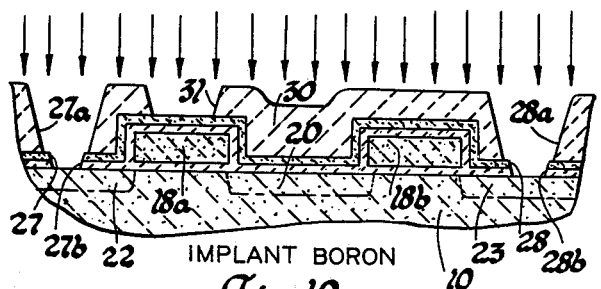
Fig.10 IMPLANT BORON
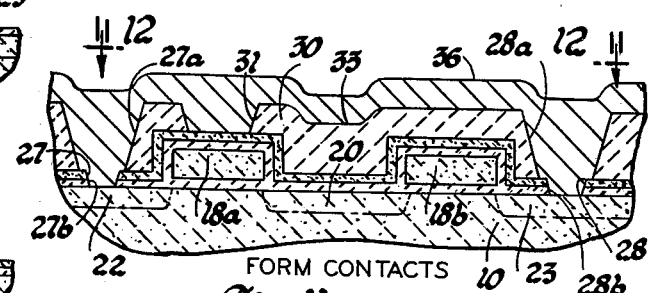
Fig.11 FORM CONTACTS
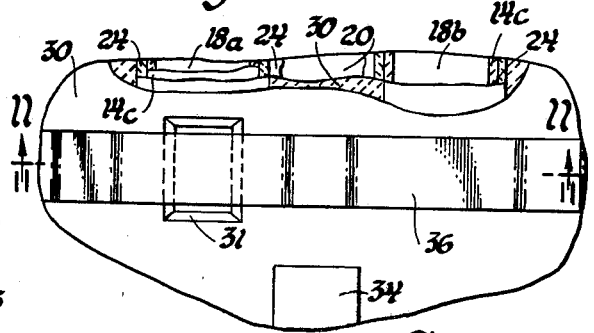
Fig.12

PROGRAMMING AN IGFET READ-ONLY-MEMORY

This is a division of application Ser. No. 098,211, filed Nov. 28, 1979, now U.S. Pat. No. 4,295,209.

RELATED APPLICATION

This application presents an improvement on my invention in United States patent application Ser. No. 098,210, entitled "Etching Windows in Thick Dielectric Coatings Overlying Semiconductor Device Surfaces", which is being concurrently filed and is assigned to the assignee hereof now U.S. Pat. No. 4,299,862.

FIELD OF THE INVENTION

This invention relates to programming a read-only-memory comprised of a matrix of insulted gate field effect transistors. More specifically, it involves programming the read-only-memory by selectively making some of the transistors in the matrix inoperative by an ion implantation step after the matrix has been formed.

BACKGROUND OF THE INVENTION

A read-only-memory, hereinafter referred to as a ROM, can be made by forming a matrix of insulated gate field effect transistors, hereinafter referred to as IGFETs. The IGFETs are arranged on a common substrate in a pattern such that the gates of individual transistors are aligned in a number of parallel input columns, and the drains of individual devices in each column are aligned in a plurality of parallel rows. Accordingly, the drains of all IGFETs can be individually contacted by an overlying metallization pattern of parallel metal strips, which in plan view are orthoganol to the parallel input gate columns. All gates in a column have a common input, and the overlying metal strips form a common output for the drains in each row. Memory devices such as these are referred to in U.S. Pat. No. 3,541,543 Crawford et al., U.S. Pat. No. 3,914,855 Cheney et al. and U.S. Pat. No. 4,129,936 Takei.

IGFET ROMs can be programmed by not making IGFETs at selected locations in the matrix or by making the IGFETs at those locations inoperative. In the latter programming technique, all devices in the matrix are made to have operable sources and gates. However, the overlying metal strips electrically contact the drains of only those IGFETs selected to provide the desired ROM output response. On the other hand, it is recognized that ancillary factors dictate that the ROM must be made considerably larger, if one is to program it at the metallization step.

Consequently, it is also recognized as desirable to program the ROM by simply not making an IGFET at matrix locations where one is not desired. In such instance, the metallization mask is always the same, regardless of the program, and the resultant ROM can thus be smaller, more reliable, less expensive, etc. One can avoid not making an IGFET at desired matrix locations in a variety of ways. In one way, a field oxide is first grown on a silicon wafer. Windows are opened in the field oxide at every matrix location where an IGFET is desired. If one does not want to form an IGFET at any given matrix location, no field oxide window is opened at that location.

On the other hand, programming the ROM so early in its process of manufacture presents other problems, such as what to do with all the ROM wafers and chips already downstream in the manufacturing process when a programming change is made. One must either discard in-process ROMs, or wait until the newly programmed ROMs show up at the end of the manufacturing process flow. To avoid such problems, it has been proposed to program the ROM as late in its process of manufacture as possible but prior to metallization. This reduces losses due to in-process ROMs and/or reduces the delay before the newly programmed ROMs can be completed. This reprogramming delay is often referred to as turn-around time. Turn-around time can be reduced by reprogramming as far downstream in the process as possible. However, to avoid increasing circuit cost, the form of the reprogramming should not require any appreciable increase in ROM size.

U.S. Pat. No. 4,129,936 Takei describes making a matrix in which IGFETS at all locations would be operable. However, ion implantation, using a photoresist layer as a mask, is used to turn off selected IGFETs by increasing gate threshold voltage. However, it should be recognized that this form of reprogramming is not immediately prior to metallization. U.S. Pat. No. 3,914,855 Cheney et al. describe using ion implantation to increase selected gate threshold voltage after metallization. Windows are provided in the metallization layer over selected IGFET gates so that those gates can be turned off by the ion beam. However, this requires a contact mask change. In addition the nature of the change is such that metallization runners must be made wide enough to go around the gates where the windows are located, and surface areas must be left on the wafer metallization layer where selected IGFETs are to be made inoperative. However, this requires contact mask change. In addition the nature of the change is such that metallization runners must be made wide enough to go around the gates where the windows are located, and surface area must be left on the wafer between devices to allow the runners to go around the gates. Another approach is disclosed in an article entitled "ROM Program Process May Beat EPROMs in Turnaround Time", appearing on pages 39 and 40 of the May 25, 1978 issue of *Electronics*. I understand that in this latter technique the implant is done after metallization, which inherently expands ROM size and special packaging.

I have found an ion implantation technique that can be used to program the ROM immediately before metallization. Also, the metallization pattern need not be widened, and no protective coating need be formed on the gate electrode after reprogramming and before metallization. Still further, I have found how to combine this reprogramming technique with a technique that insures good contacts to source and drain regions, even if contact masks are slightly misaligned or undesirable lateral contact window etching occurs for other reasons.

OBJECTS AND SUMMARY OF THE INVENTION

It is therefore an object of this invention to provide an improved technique for programming an IGFET ROM late in the process of making the ROM.

The invention comprehends forming an array of IGFETs on a semiconductor surface with each of the IGFETs having an operable channel region and gate electrode. The gate electrode is penetrable by an ion beam. A blanket layer of a first dielectric, also permeable by the ion beam, is deposited onto the array. A blanket layer of a second dielectric, not significantly penetrable by the ion beam, is deposited onto the first dielectric material. Windows are then etched in the second dielectric material over the channel regions of selected IGFETs in the array, using an etchant that does not also attack the first dielectric. The array is then irradiated with an ion beam in a dose effective to significantly increase the threshold voltage of the selected IGFETs. A metallization pattern is then formed on the second dielectric. The first dielectric provides an insulating coating within the implant windows for any metallization portions which must cross the gate electrodes. The first dielectric is preferably silicon nitride and the second is preferably glass.

BRIEF DESCRIPTION OF THE DRAWING

Other objects, features and advantages of this invention will become more apparent from the following description of preferred examples thereof and from the drawings, in which:

FIGS. 1 through 11 show a series of sectional views through two IGFET areas of a read-only-memory integrated circuit showing progressive stages of its manufacture;

FIG. 11 is taken along the line 11—11 of FIG. 12;

FIG. 12 shows a plan view with parts broken away along the line 12—12 of FIG. 11; and For clarity, background lines are omitted in FIGS. 1 through 11 and surface relief is substantially omitted in FIG. 12.

DESCRIPTION OF THE PREFERRED EMBODIMENTS

Reference is now made to the drawing, in which fabrication of two adjacent IGFETs is described. It is to be understood that these two IGFETs form merely one part of a matrix of IGFETs comprising a read-only-memory such as hereinbefore described. It is to be understood that an IGFET read-only-memory is a matrix comprising hundreds and even thousands of IGFETs arranged in an array of columns and rows, with adjacent columns of IGFETs sharing the same source region and the same gate electrode. In a typical arrangement, the source regions of all IGFETs in a column are electrically in parallel by extending the source diffusion region between adjacent IGFET pairs in the column. In such instance, the interconnected source regions appear as an elongated strip. To conserve space, the same strip-like source region diffusion also serves as the source region for an adjacent column of IGFETs. In plan view, the resultant configuration appears as a strip-like diffusion area lying between two parallel gate electrodes. In sectional view, the resultant configuration appears as shown in FIGS. 1-11. A discrete drain region is diffused in the wafer surface for each IGFET, along the outer edges of the gate electrode pairs. Drain regions are aligned in rows.

It is to be recognized that one or more IGFETs of a ROM are frequently formed on a mesa upstanding on the silicon surface, surrounded by more highly doped silicon surface areas that have a relatively thick overlying field oxide. Such a construction is illustrated in U.S. Pat. No. 3,751,722 Richman and in the *Electronics* article hereinbefore cited. However, to focus attention more clearly on the programming improvement of this invention, and how it is associated with an overlying relatively thick glass layer, applicant has elected to omit showing the mesa construction and the thick field oxide. However, it is to be understood that it may be preferred to use this invention as a mesa-type IGFET ROM.

With the foregoing in mind, FIG. 1 shows an area of a P-type silicon wafer 10 where an IGFET pair from two adjacent ROM columns is to be formed. The wafer has a thickness of about 0.4–0.6 millimeter and a homogeneous resistivity of about 5–30 ohm-centimeters. The resistivity of course will depend upon electrical characteristics of the finished ROM which are desired. The thickness is ordinarily a function of the wafer size being processed, with 3 inch wafers usually being about 0.4 millimeter thick. Upper surface 12 of the wafer is lapped, polished and cleaned so that one or more integrated circuit matrixes can be formed on it. If this were to be a mesa device, a thick field oxide and P+ surface enhancement would be provided over the entire wafer surface except for areas where IGFETs are to be made. However, as hereinbefore mentioned, to simplify this disclosure, the mesa, thick field oxide and the P+ enhancement layer are not shown.

A thin layer 14 of silicon dioxide, preferably about 500–1000 angstroms thick, is then formed on surface 12 of wafer 10 as shown in FIG. 2. The thin silicon dioxide layer 14 can be formed by heating the silicon wafer 10 in dry or wet oxygen at a temperature of about 900°–1100° C. until the layer of silicon dioxide of the desired thickness is obtained. Time and treatment of course will depend upon the thickness desired and the precise temperature of the treatment. However, a thickness of about 1000 angstroms can be formed by heating wafer 10 in dry oxygen for about one hour at a temperature of about 1050° C. This forms a thin silicon dioxide layer which is suitable as a gate dielectric in an IGFET and which is readily penetrable by an ion beam having an energy greater than about 150 kev.

A blanket layer 18 of polycrystalline silicon is then deposited onto the silicon dioxide layer 14 as shown in FIG. 3. The polycrystalline silicon layer 18 can be formed by chemical vapor deposition, evaporation, sputtering or the like. In general, it would have a thickness of about 4000–7000 angstroms for self-aligning gate purposes. At least 4000 angstroms is generally needed to obtain a low resistance gate. Above about 7000 angstroms in thickness, the polycrystalline silicon layer produces undesirably high step heights. Also, thicknesses above about 7000 angstroms may require ion beam energies greater than about 150–200 kev to penetrate them. It should be recognized that the polycrystalline silicon will eventually be in the form of parallel bars that must be crossed by an overlying metallization network. The polycrystalline silicon layer 18 is preferably undoped, i.e. intrinsic, as deposited and then subsequently doped with an N-type impurity during the diffusion step which forms source and drain regions 20 and 22 in one of the succeeding process steps. I prefer to dope the polycrystalline silicon with phosphorus to a sheet resistivity of about 20–50 ohms per square. On the other hand, there is no objection to doping the polycrystalline silicon while it is being deposited. It is simply unnecessary. It should also be recognized that ion implantation can be used instead of diffusion to dope the polycrystalline silicon and form the source and drain regions 20 and 22.

In the next step of my process, illustrated in FIG. 4, the polycrystalline silicon layer 18 and the silicon dioxide layer 14 are then successively photolithographically etched to define discrete gate electrodes 18a and 18b, each of which has an underlying gate dielectric 14a and 14b. These layers can be etched in much the same way as described in U.S. Pat. No. 3,475,234 Kerwin et al. The particular manner in which the gate dielectric and electrode are defined forms no part of this invention. They can be defined in any convenient manner, including plasma etching. In any event, the definition of the gate electrodes 18a and 18b and gate dielectrics 14a and 14b inherently exposes wafer surface areas 12a and 12b which will subsequently respectively overlie source and drain regions of an IGFET pair.

It should also be noted in connection with FIG. 4 that the gate electrodes 18a and 18b are in fact parallel strips of polycrystalline silicon. Surface area 12a is a continuous uninterrupted strip of the silicon surface extending the entire length of gate electrodes 18a and 18b. On the other hand, wafer surface areas 12b are not continuous strips, like surface area 12a. Instead, they are square areas when observed in plan view. However, because background lines are omitted in the drawing, the individual square surface areas 12b appear to be the same as the strip-like surface area 12a. Many identical square areas 12b are spaced along the length of gate electrode 18a. Analogously, many identical square areas 12b are spaced along the length of gate electrode 18b. The individual square areas are paired on opposing sides of gate electrodes 18a and 18b, so that they can be connected to a common output strip, as will hereinafter be explained.

Phosphorus is then diffused into the gate electrodes 18a and 18b, and into the exposed surface portions 12a and 12b of wafer 10 to produce a strip-like source region 20 and a plurality of drain regions 22 and 23. As indicated in the preceding paragraph, drain regions 22 and 23 are square when viewed from above and are aligned with similar square areas spaced apart along the length of the gate electrodes 18a and 18b. The phosphorus can be deposited onto and slightly diffused into the wafer by placing the wafer in a furnace maintained at a temperature of 950°–1050° C. About 3.5 liters per minute argon and 10–50 cc per minute oxygen flows through the furnace. After a five minute wafer preheat, additional argon is bubbled through phosphorus oxychloride at about 21° C. and bled into the furnace atmosphere at a rate of about 10–100 cubic centimeters per minute. After a second five minute period, the additional argon flow is discontinued. The wafer is left in the furnace for a third five minute period as a post-bake step. The wafer is then heated to a temperature of about 900°–1050° C. for about ½–2 hours in a moderately to strongly oxidizing atmosphere, to drive-in the phosphorus. The particular times, temperatures and atmospheres used for the deposition and drive-in are obviously a matter of choice, and are principally determined by the electrical characteristics of the device desired. Concurrently, a thin silicon dioxide coating 14c is reformed over the surface portions 12a and 12b and also over the sides 18a' and 18b' in upper surfaces 18a'' 18b'' of the polycrystalline gate electrodes 18a and 18b. This coating 14c will range in thickness from about 100–1000 angstroms, and is a thickness primarily to prevent deterioration of surface portions 12a and 12b during the aforementioned drive-in.

FIG. 6 shows the wafer surface after a blanket layer of silicon nitride ($Si_3N_4$), indicated by reference numeral 24, has been deposited over silicon dioxide layer 14c. The silicon nitride layer 24 is relatively thin, only about 200–1000 angstroms in thickness. Below about 200 angstroms, the silicon nitride coating 24 may not be continuous, for example, by not completely covering the sides 18a' and 18b' of their respective gate electrodes 18a and 18b. Thicknesses greater than about 1000 angstroms appear to be unnecessary. They require progressively more powerful ion beams, to penetrate them. Also, when the silicon nitride thickness reaches about 2000 angstroms, its difference in thermal expansion properties, from those of silicon can cause silicon nitride cracks.

The manner in which the silicon nitride layer 24 is deposited is not particularly critical, and any of the normal and accepted techniques can be used. Pyrolysis of a silicon containing hydrocarbon gas at high temperature is disclosed in U.S. Pat. No. 3,917,495 Horn. A glow discharge plasma reaction between silane and nitrogen with or without ammonia at about 300° C. is described in U.S. Pat. No. 4,091,406 Lewis for producing a silicon nitride coating that is not quite stoichiometric.

After depositing the blanket silicon nitride coating, source and drain region contact windows are photolithographically opened in it in the normal and accepted manner. FIG. 7 only shows drain region windows 27 and 28 open in the silicon nitride coating 24. A source region contact window is not shown in FIG. 7 because it is not in the plane of the cross-sectional view shown in FIG. 7. Instead it is located at the end of the strip-like source diffusion region 20, where it serves as a common contact for both columns of IGFETs served by gate electrodes 18a and 18b. A low resistance electrical contact 34 is subsequently made to the source region through this window to provide a source region electrode. The contact windows can be opened in the silicon nitride coating 24 by plasma etching with carbon tetrafluoride or by immersion for 10–60 minutes in orthophosphoric acid ($H_3PO_4$), at 150°–160° C.

After the source and drain contact windows are opened in the silicon nitride layer, a relatively thick blanket layer of phosphorus doped glass is deposited onto the silicon nitride layer 24. The wafer is then heated to reflow the glass and provide a smooth upper surface 33 on glass layer 30 as shown in FIG. 8. The upper surface 33 corresponds to the smooth upper surface 30b in my aforementioned U.S. Pat. No. D-3,761. The phosphorus doped glass can be deposited in any convenient manner, as for example by chemical vapor deposition. Any of the normal and accepted practices and glass-like materials ordinarily used to passivate and smooth out the surface of IGFET ROMs can be used in this invention too. One technique is that the glass layer 30 is formed by chemical vapor deposition of silane and phosphine. The minimum thickness of glass which is needed to smooth out the upper surface of the wafer will vary. However, a thickness of about 5000 to 15,000 angstroms is ordinarily preferred. One desires enough to block an ion beam and smooth out the wafer surface but not so much that etching is too difficult. Since the silicon nitride coating previously applied in accordance with this invention does not appreciably round the corners on gate electrodes 18a and 18b, the normal thickness ordinarily used to passivate IGFET ROMs would be used in this invention also.

As mentioned, the glass coating 30 is of a composition which is reflowed to provide a smoother surface 33 on which to subsequently deposit a metallization pattern. Any silicate serving this function is considered to be a glass for purposes of this invention. I prefer to use a glass having a melting point temperature that permits reflow at about 1000°–1100° C. in about 10 minutes. Higher temperatures and/or longer periods of time are generally not desired, since they can produce additional unwanted diffusion within the wafer 10.

Next the glass layer 30 is photolithographically etched to open contact windows in it over the source region 20 and the drain regions 22 and 23. FIG. 9 shows windows 27a and 28a over the drain regions 22 and 23. The source region contact window is not shown because it is out of the plane of the drawing as mentioned in connection with FIG. 7. In substance, a window is photolithographically etched in the glass layer 30 in the normal and accepted manner over each opening in the silicon nitride layer 24. A hydrofluoric acid-based etchant is used, which attacks glass layer 30 and silicon dioxide layer 14c but not silicon nitride layer 24. Opening windows 27a and 28a in the thick glass layer 30 inherently also opens windows 27b and 28b in the silicon dioxide layer 14c.

Concurrently, however, an additional window 31 is opened over that portion of strip-like gate electrode 18a which extends between the square drain area 22 shown in the drawing and the strip-like source region 20. That gate portion overlies a channel portion of an IGFET formed by discrete drain diffusion 22 and source region 20. The portion of the silicon nitride layer 24 uncovered within window 31 remains intact over the channel and gate electrode 18a, because the hydrofluoric acid etchant used to open the window in glass layer 30 does not attack silicon nitride.

Gate oxide 14a, gate electrode 18a, silicon dioxide layer 14b and silicon nitride layer 24 are individually penetrable by an energetic ion beam, as hereinbefore mentioned. However, they are also penetrable by the ion beam when combined. As represented in FIG. 10, the entire surface of the wafer is uniformly implanted with boron. The implant is performed by a $B^{11}$ ion beam having an energy of about 150–200 kev in a dosage of about $1 \times 10^{12}$ to $1 \times 10^{14}$ ions per square centimeter. Such a dosage does not materially reduce the high surface concentration and low resistance of contacts to the surface portions 12a and 12b exposed within the contact windows because of the high doping used when forming regions 20, 22 and 23. On the other hand, such a dosage is sufficient to raise the threshold voltage of the IGFET channel region between source region 20 and drain region 22 exposed to the beam under window 31 to a high enough value that the voltage normally applied to gate 18a will not turn that gate on. Hence, that gate is rendered inoperative. The analogous gate between source 20 and drain 23 under gate electrode 18b remains operative because no window was cut in the overlying portion of the glass layer 30. Because its channel was protected by the glass layer 30, the boron implantation did not reach it and its threshold voltage remains low. Accordingly, it provides an electrical communication path between source region 20 and drain region 23 when an operating voltage is applied to gate electrode 18b.

In general, ion implantation can raise channel threshold voltage 7–20 volts, so that the operating voltage of the gate electrode can be set at about 5 volts without fear of turning on the gate exposed within window 31. Also, the implant power and dosage is thus not especially critical. If the channel has a threshold voltage higher than the operating voltage it is considered unaffected, or inoperative, in the circuit which it comprises. In some instances, one may wish to implant the channel with phosphorus, so that the gate is always on, and thus unaffected by the gate operating voltage. In any event, my process should at least permit one to change the programming on wafers that are already in process at a very late stage in their manufacture, without any of the aforementioned penalties.

I mention in my concurrently filed U.S. Pat. No. D-3,761 that glass layer 30 has been often so difficult to etch satisfactorily that two separately exposed and developed photoresist layers were used when etching it. In such instance two separate masking operations are involved, which use two similar yet slightly different masks. The first mask is essentially the same as the second mask but has somewhat smaller openings in it. Such double masking has previously been used to insure that the photoresist coating will withstand the rigors of etching through the relatively thick, about 10,000 angstroms, glass layer. The double masking is principally used to avoid the detrimental effects of pin holes that might occur in each layer. Since the pin holes are random they are not likely to be superimposed when two layers are used. On the other hand, in this invention silicon nitride layer 24 already protects the silicon surface 12 and the oxide layer 14c from pin holes that might occur in the photoresist. Consequently, it is likely that such double masking is unnecessary when etching the glass layer 30 in accordance with this invention. In such instance, the first glass etch mask can, instead, be used to etch source and drain contact holes in the silicon nitride layer 24. Then, only one glass etch mask need be changed when one wishes to change the program of the ROM being made, and no additional masks are needed over a conventional two contact mask process.

The metallization pattern is then formed on the upper surface of the wafer as shown in FIGS. 11 and 12. Any of the normal and accepted metals and methods of forming the pattern can be used. For example, the metallization pattern can be formed by evaporating a blanket layer of metal onto the entire upper surface of the slice. The metal layer fills the windows for the source and drain contacts as well as the window 31 in glass layer 30 overlying gate electrode 18a. The metal contacts the wafer surfaces 12a and 12b to make a low resistance electrical connection with source region 20 and drain regions 22 and 23. However, since gate electrode 18a is covered with the silicon dioxide layer 14b and silicon nitride layer 24, it is electrically isolated from the metallization pattern. The metal forming the pattern can be a single layer of aluminum, or a multiplicity of layers, including gold and silver, just as in any other ROM.

The blanket metal layer can be photolithographically etched in a normal and accepted manner to define source electrode 34 and drain electrode 36. Source electrode 34 is not shown in FIG. 11 since it is out of the plane of view in FIG. 11. However, it can be seen in FIG. 12. Thus, electrode 34 forms a common contact to the source regions for two IGFETs which share a common source region. Drain electrode 36 as can be seen in FIG. 12 is in fact a longitudinal strip running orthogonally to the gate electrodes 18a and 18b. In this invention, electrical isolation between drain electrode 36 and the underlying gate electrode 18a is preserved even though there is a window 31 in the covering glass coating 30. Isolation is preserved because the earlier deposited silicon nitride layer 24 provides electrically insulating coatings. It permits electrode 36 to cross gate 18a without requiring deposit of an additional insulating coating onto the wafer surface after ion implantation and before metallization. It should also be recalled that a ROM will contain many such paired IGFET columns, with drains of all the columns arrayed in a series of rows. It is necessary that the drain electrode 36 for each row cross many gate electrodes such as gate electrodes 18a and 18b.

The embodiments of this invention in which an exclusive property or privilege is claimed are defined as follows:

1. A method of making a read-only-memory comprising the steps of:
   forming an array of IGFETs on a semiconductor surface, each of said IGFETs having an operable channel region underlying a gate dielectric and electrode that is penetrable by an ion beam;
   depositing a blanket layer of a first dielectric material onto said array, which layer is permeable by an ion beam;
   depositing a blanket layer of a second dielectric material onto the first dielectric layer, which second layer is not significantly penetrable by said ion beam and can be preferentially etched;
   etching windows in said second dielectric layer over channel regions of selected IGFETs in said array with an etchant that does not also attack the first dielectric layer, and thus does not uncover said gate electrodes;
   exposing said windows and second dielectric layer to said ion beam in a dose effective to make said selected IGFETs unaffected by gate operating voltage, and thereby encode said array; and
   electrically contacting all of said IGFETs, even those made inoperative, whereby the first dielectric layer uncovered in said windows provides electrical insulation between at least one drain electrode and a gate electrode.

2. A method of making a read-only-memory comprising the steps of:
   forming an array of IGFETs on a semiconductor surface, each of said IGFETs having an operable channel region underlying a gate dielectric and electrode that is penetrable by an ion beam;
   depositing a blanket layer of a first dielectric material onto said array, which layer is permeable by an ion beam;
   opening electrical contact windows in said first dielectric layer over source and drain regions of all of said IGFETs;
   depositing a blanket layer of a second dielectric material onto the first dielectric layer, which second layer is not significantly penetrable by said ion beam and can be preferentially etched;
   etching ion implant windows in said second dielectric layer over channel regions of selected IGFETs in said array with an etchant that does not also attack the first dielectric layer effective to uncover source and drain contact areas for all of said IGFETs but not uncover gate electrodes;
   exposing all of said windows and second dielectric layer to said ion beam in a dose effective to make said selected IGFETs inoperative but not significantly compensate IGFET source and drain regions, and thereby encode said array; and
   applying electrodes to all of said contact areas, including those of IGFETs made inoperative, and interconnecting some of them with integral electrode extensions crossing ion implant windows while insulatingly supported on the first dielectric layer.

3. A method of making a read-only-memory comprising the steps of:
   forming an array of IGFETs on a semiconductor surface, each of said IGFETs having an operable channel region underlying a gate dielectric and a polycrystalline silicon gate electrode that are both penetrable by an ion beam;
   depositing a blanket coating of silicon nitride onto said array in a layer thin enough to be permeable by an ion beam;
   opening electrical contact windows in said silicon nitride coating over source and drain regions of all of said IGFETs;
   depositing a blanket coating of a phosphorus doped glass onto the silicon nitride coating in a layer thick enough to mask underlying surfaces from said ion beam;
   etching ion implant windows in said glass coating over channel regions of selected IGFETs in said array using an etchant that does not also attack the silicon nitride coating, and thus uncover said polycrystalline silicon gate electrodes;
   exposing all of said windows and second dielectric layer to said ion beam in a dose effective to render said selected IGFETs inoperative, and thereby encode said array; and
   electrically contacting all of said IGFETs, even those rendered inoperative in the preceding step, whereby said array is encoded late in the process of making it and read-only-memory size is not significantly enlarged.

* * * * *